United States Patent
Cohen et al.

(10) Patent No.: US 12,150,392 B2
(45) Date of Patent: Nov. 19, 2024

(54) TRANSFER LENGTH PHASE CHANGE MATERIAL (PCM) BASED BRIDGE CELL

(71) Applicant: International Business Machines Corporation, Armonk, NY (US)

(72) Inventors: Guy M. Cohen, Westchester, NY (US); Takashi Ando, Eastchester, NY (US); Nanbo Gong, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 440 days.

(21) Appl. No.: 17/130,068

(22) Filed: Dec. 22, 2020

(65) Prior Publication Data

US 2022/0199899 A1    Jun. 23, 2022

(51) Int. Cl.
*H10N 70/20* (2023.01)
*H10B 63/10* (2023.01)
*H10N 70/00* (2023.01)

(52) U.S. Cl.
CPC .......... *H10N 70/231* (2023.02); *H10B 63/10* (2023.02); *H10N 70/8828* (2023.02); *H10N 70/8833* (2023.02)

(58) Field of Classification Search
CPC .................................................. H10N 70/231
See application file for complete search history.

(56) References Cited

U.S. PATENT DOCUMENTS

| | | | |
|---|---|---|---|
| 7,038,231 B2 | 5/2006 | Hart | |
| 7,635,855 B2 | 12/2009 | Chen | |
| 7,688,619 B2 | 3/2010 | Lung | |
| 9,543,515 B2 | 1/2017 | Gealy | |
| 9,646,243 B1 | 5/2017 | Gokmen | |
| 10,373,051 B2 | 8/2019 | Gokmen | |
| 2007/0272987 A1 | 11/2007 | Kang | |
| 2008/0164453 A1 | 7/2008 | Breitwisch | |
| 2008/0285333 A1 | 11/2008 | Lankhorst et al. | |
| 2010/0055830 A1* | 3/2010 | Chen | H10N 70/884 438/102 |
| 2010/0144128 A1* | 6/2010 | Lung | G11C 13/0028 438/482 |
| 2010/0195378 A1* | 8/2010 | Lung | H10B 63/20 365/163 |
| 2010/0301304 A1* | 12/2010 | Chen | H01L 27/0688 438/682 |

(Continued)

FOREIGN PATENT DOCUMENTS

| | | |
|---|---|---|
| CN | 114665010 A | 6/2022 |
| DE | 20321085 U1 | 2/2006 |

(Continued)

OTHER PUBLICATIONS

Examination Notice dated Apr. 28, 2023, DE Application No. 10 2021 130 641.8, Filed Nov. 23, 2021, 9 pages.

(Continued)

*Primary Examiner* — Mounir S Amer
(74) *Attorney, Agent, or Firm* — Monchai Chuaychoo

(57) ABSTRACT

A tunable nonvolatile resistive element, wherein the device conductance is modulated by changing the length of a contact between a phase change material and a resistive liner. By choosing the contact length to be less than the transfer length a linear modulation of the conductance is obtained.

14 Claims, 7 Drawing Sheets

(56) References Cited

U.S. PATENT DOCUMENTS

| | | | |
|---|---|---|---|
| 2012/0069645 A1* | 3/2012 | Goux | H10N 70/8828 |
| | | | 365/163 |
| 2012/0273742 A1 | 11/2012 | Minemura | |
| 2013/0075684 A1 | 3/2013 | Kinoshita | |
| 2015/0243709 A1 | 8/2015 | Song | |
| 2018/0160985 A1* | 6/2018 | Willis | A61B 5/7253 |
| 2018/0205017 A1* | 7/2018 | Bruce | H10B 63/84 |
| 2019/0097128 A1 | 3/2019 | Jonnalagadda | |
| 2019/0157556 A1 | 5/2019 | Brightsky | |
| 2020/0058872 A1 | 2/2020 | Rose | |
| 2020/0059229 A1 | 2/2020 | Howard et al. | |
| 2020/0066980 A1 | 2/2020 | Cohen | |
| 2020/0144497 A1 | 5/2020 | Howard et al. | |
| 2020/0227475 A1 | 7/2020 | Park | |
| 2020/0388760 A1 | 12/2020 | Bruce | |
| 2021/0249597 A1* | 8/2021 | Wu | H10N 70/231 |

FOREIGN PATENT DOCUMENTS

| | | |
|---|---|---|
| DE | 112018004630 T5 | 7/2020 |
| DE | 102021130641 A1 | 6/2022 |
| GB | 2603612 A | 8/2022 |
| JP | 2022099300 A | 7/2022 |

OTHER PUBLICATIONS

"Response to UK Search and Examination Report", UK Patent Application No. 2117423.0, Feb. 17, 2023, 14 pages.

"Patents Act 1977: Combined Search and Examination Report under Sections 17 and 18(3)", Your Reference: DP/P49942GB, Application No. GB2117423.0, May 27, 2022, 10 pages.

Gokmen et al., "Acceleration of Deep Neural Network Training with Resistive Cross-Point Devices: Design Considerations," Frontiers in Neuroscience, vol. 10, Article 333, 2016, 13 pages.

Huang et al., "Contact resistance measurement of Ge2Sb2Te5 phase change material to TiN electrode by spacer etched nanowire," Semiconductor Science and Technology, vol. 29, No. 9, 2014, 095003, 10 pages.

Shuang et al., "Contact resistance change memory using N-doped Cr2Ge2Te6 phase-change material showing non-bulk resistance change," Applied Physics Letters, vol. 112, No. 18, 2018, 183504, 6 pages.

Lapedus, Mark, "Neuromorphic Chip Biz Heats Up, Semiconductor Engineering" Jan. 21, 2016, <https://semiengineering.com/neuromorphic-chip-biz-heats-up/>, 4 pages.

Foreign Search Report, Patents Act 1977: Examination Report under Section 18(3), Application No. GB2117423.0 dated Nov. 20, 2023.

Intellectual Property Office, "Patents Act 1977: Examination Report under Section 18(3)" Jul. 23, 2024, 7 Pages, GB Application No. 2117423.0.

* cited by examiner

TRANSFER LENGTH PHASE CHANGE MATERIAL (PCM) BASED BRIDGE CELL

BACKGROUND

The present invention relates generally to the field of phase change materials, and more particularly to an efficient and practical implementation of phase change materials bridge cell.

A phase change material or PCM is a material that can be switched from one phase to another. Based on the properties of the different phases, PCMs have been explored for their use as a memory element as well as a tunable resistor for cognitive computing. Namely, most PCM provides a relatively high resistance when it is in an amorphous phase, and a relatively low resistance when it is in a crystalline phase.

A resistive processing unit (RPU) stores information based on the resistance of the RPU. During programming, a full SET operation is used to program the RPU to a low-resistance state representing a data value such as a logic '1' or a logic '0'. A subsequent full RESET operation is then used to return the RPU to its previous high-resistance state. A partial SET or a partial RESET can be used to tune the RPU to an intermediate resistance state.

Conventional PCM RPU devices often employ the PCM material as a layer disposed between two electrodes. For instance, the PCM material can be patterned into a bar shape or a fin shape and two contacts are formed at the opposing ends of the bar. This configuration is referred to herein as a bridge cell design.

However, most PCM materials exhibit a resistance drift, which is typically more pronounced after a RESET pulse is applied. This drift is undesired for applications where the bridge device is used as an RPU.

Accordingly, a RPU designs and techniques for fabrication thereof with reduced drift would be desirable.

SUMMARY

According to an aspect of the present invention, there is a neuromorphic device that includes, but is not necessarily limited to, the following components: (i) a phase change material bar, with the phase change material bar being structured and configured to have at least two portions that are joined by a first narrow portion, and with the first narrow portion being located at the center of the phase change material bar; (ii) a resistive liner located adjacent the phase change material bar, with the resistive liner being a conduit for conducting at least a portion of a first electric current; (iii) an interfacial layer located between the resistive liner and the phase change material bar, with the interfacial layer having a tunable contact resistance; and (iv) a set of ohmic contact portions, with at least one ohmic contact of the set of ohmic contact portions being located at each end of the phase change material bar.

According to an aspect of the present invention, there is a method of operating the neuromorphic device, including the following operations (and not necessarily in the following order): (i) providing a neuromorphic device, with the neuromorphic device including a crystalline-phase change portion, a resistive liner, and an engineered interfacial layer; and (ii) applying a RESET pulse to the device to form an amorphous phase change portion. According to an aspect of the present invention, the size of the amorphous phase change portion set the contact length between the crystalline phase change portion and the resistive liner. Additionally, according to an aspect of the present invention, a larger RESET pulse yields a shorter contact length and accordingly lower conductance.

According to an aspect of the present invention, there is a method of assembling the neuromorphic device, including the following operations (and not necessarily in the following order): (i) providing a phase change material (PCM) bar, with the PCM bar including a crystalline-phase portion and an amorphous-phase portion; (ii) placing a resistive liner adjacent to the PCM bar; (iii) placing an engineered interfacial layer between the PCM bar and the resistive liner so that the engineered interfacial layer acts as a contact buffer between the PCM bar and the resistive liner; (iv) a set of ohmic contacts on each end of the PCM bar, with the set of ohmic contacts; and (v) encapsulating the PCM bar.

DETAILED DESCRIPTION

Figure 1:
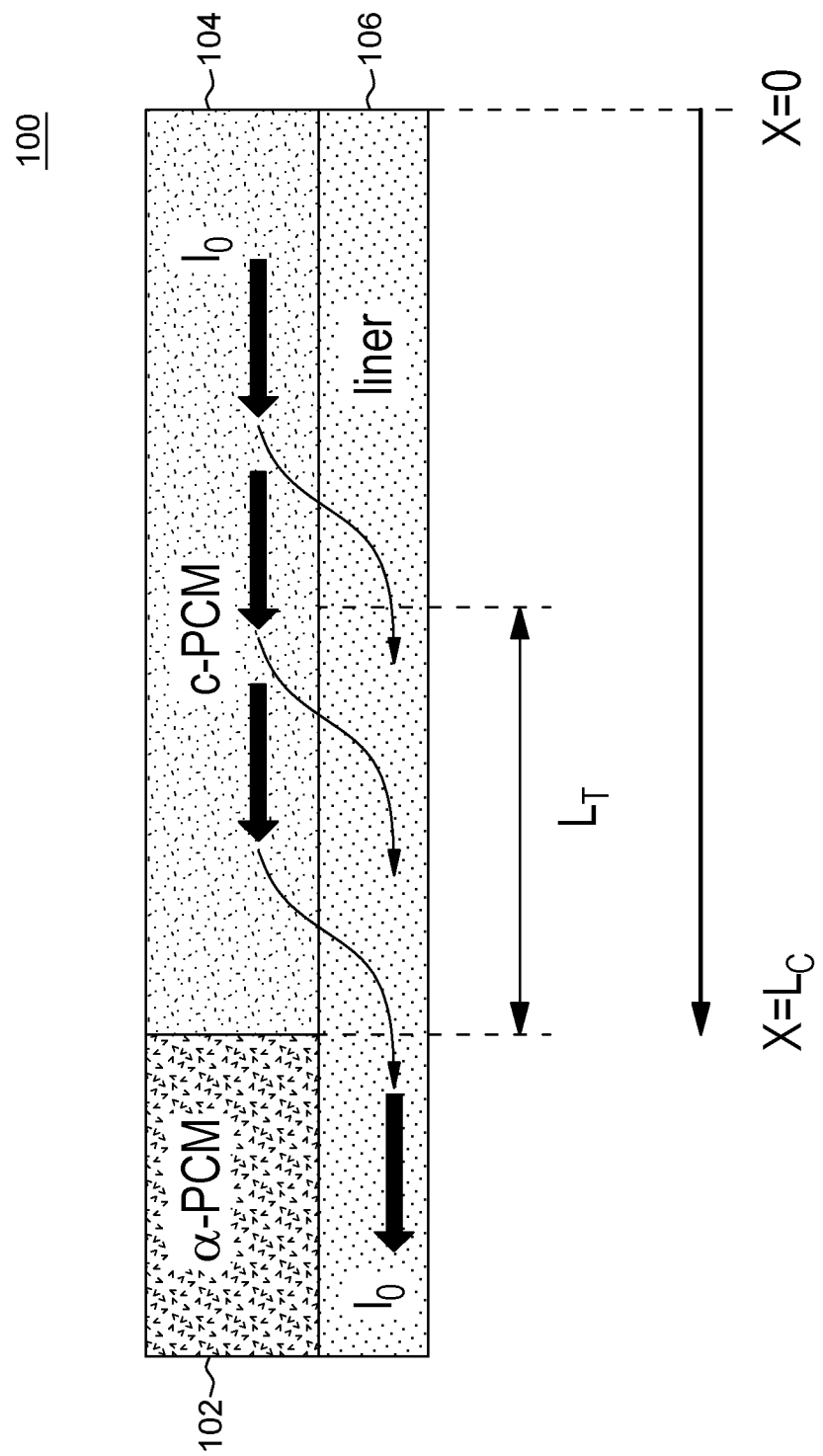
FIG. 1 is a block diagram of a first embodiment structure according to the present invention.

Some embodiments of the present invention are directed towards a tunable nonvolatile resistive element, wherein the device conductance is modulated by changing the length of a contact between a phase change material and a resistive liner. By choosing the contact length to be less than the transfer length a linear modulation of the conductance is obtained.

Some embodiments of the present invention provide for a neuromorphic device. This neuromorphic device includes at least the following components: (i) a phase change material that is patterned into a bar that has a narrow portion located at its center; (ii) a resistive liner; (iii) an interfacial layer that is located adjacent to the resistive liner and the phase change material; and (iv) ohmic contacts at each end of the phase change material bar. In some embodiments of the present invention, the phase change material bar (sometimes herein referred to as a PCM bar) is comprised of an amorphous-phase portion and a crystalline-phase portion.

In some embodiments, the engineered interfacial layer composition and thickness is used to tune the contact resistance between the phase change material and the resistive liner. Additionally, in some embodiments, the neuromorphic device further includes an insulator region at each end of the resistive liner, which effectively limits the resistive liner span on each side to one transfer length measured from the end of the narrow phase change bar portion to the beginning of the insulator region.

Embodiments of the present invention are composed of various materials. This paragraph will include several non-limiting and illustrative examples of materials of which various components (as discussed above) of the neuromorphic device are comprised. The phase change material bar can be any of the following: $Ge_2Sb_2Te_5$, $Sb_2Te_3$, and/or GeTe. The resistive liner can include any of TaN, amorphous carbon, and/or TiN. The interfacial layer can include any of $Si_3N_4$, $HfO_2$, $Al_2O_3$, $SiO_2$, $TiO_2$ and TaNO.

In some embodiments of the present invention, the resistance of the neuromorphic device is modulated by changing the contact length between the crystalline-phase portion of the PCM bar and the resistive liner. In some instances, changing the contact length between the crystalline phase change material and the resistive liner is done by changing the size of the amorphous phase change material. To further contextualize the changing of the contact length, the amorphous phase change material resistance is at least one hundred (100) times larger than the resistive liner.

Some embodiments of the present invention may include one, or more, of the following features, characteristics and/or advantages: (i) conduction occurs through the resistive liner; (ii) resistive drift mitigation can take place at any applied level of resistance; (iii) conductance is approximately linear with the size of the amorphous region; (iv) contact resistance can be tuned by choice of liner or by engineering the liner/crystalline-phase PCM interface; (v) the range of resistance the neuromorphic device can provide is from the liner resistance (low end) to any high resistance as long as the current does not flow through the amorphous region; and (vi) the neuromorphic device can be implemented as a vertical or horizontal bridge cell. In some embodiments of the present invention, the effective contact length ($L_C$) is modulated by changing the size of the amorphous-phase portion of the PCM bar when the contact length is less than the transfer length $L_T$ (that is, $L_C \ll L_T$).

The transfer length $L_T$ is calculated using the following formula (F1):

$$L_T = \sqrt{\frac{\rho_c}{R_{liner} + R_{GST}}} \quad \text{(F1)}$$

In this formula (F1), $\rho_C$ represents the contact resistance between the liner (such as liner 106, mentioned below in connection with the discussion of FIG. 1) and the crystalline-phase portion of the PCM bar (such as crystalline-phase portion 104, mentioned below). The resistance variable ($R_{LINER}$) represents the value of the sheet resistance of the liner film and the resistance variable ($R_{GST}$) represents the value of the sheet resistance of the PCM bar material (typically referring to the crystalline-phase portion). In some embodiments of the present invention, the liner resistance is chosen to be approximately equal to the c-PCM resistance, but much lower than the amorphous PCM (a-PCM) resistance. The liner resistance is chosen such that $R_{LINER} \ll R_{a-PCM}$ so that an electric current that is applied to the PCM bar material flows through the resistive liner because the $R_{a-PCM}$ is very high compared to the $R_{LINER}$ (as further illustrated in the figures below).

The following discussion of the figures (FIGS. 1-6) discuss various embodiments of the present invention, including the structure, fabrication and methods of operating the PCM bar.

Diagram 100 of FIG. 1 is a cross section view of a phase change material bar where the contact length ($L_C$) is larger than the transfer length $L_T$. Diagram 100 includes the following components: amorphous-phase portion 102, crystalline-phase portion 104, and resistive liner 106. Since the contact length ($L_C$) between the crystalline-phase portion 104 and the resistive liner 106 is considerably larger than the transfer length (that is, $L_C \gg L_T$), the device resistance is mostly that of the c-PCM resistance and the resistive liner resistance. The contact resistance contribution is small.

Figure 2:
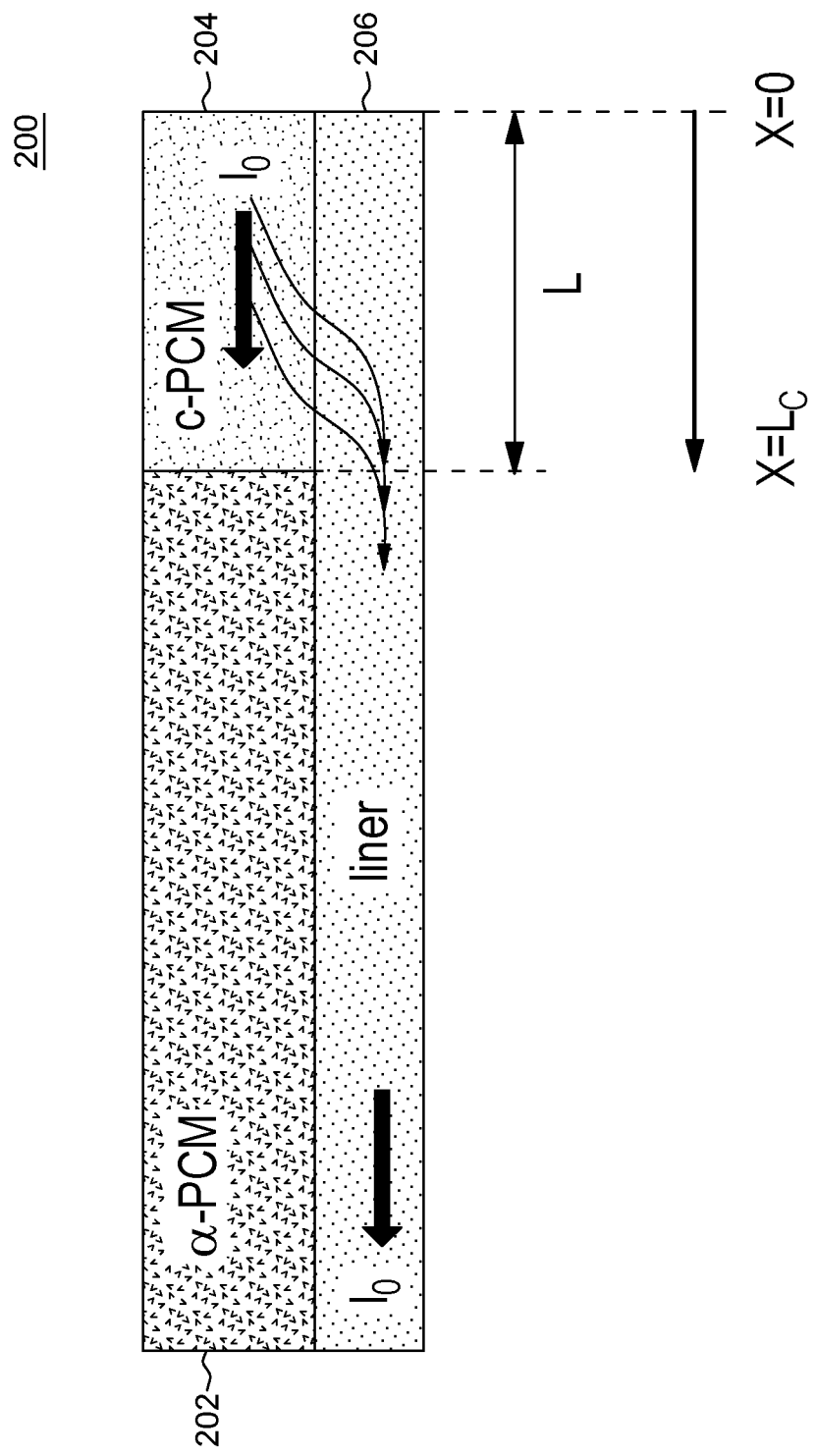
FIG. 2 is a block diagram of a second embodiment structure according to the present invention.

Diagram 200 of FIG. 2 is a cross section view of a phase change material bar where the contact length ($L_C$) is smaller than the transfer length $L_T$. Diagram 200 includes the following components: amorphous-phase portion 202, crystalline-phase portion 204, and resistive liner 206.

Since the contact length ($L_C$) between the liner and crystalline-phase portion 204 and the resistive liner 206 is equal to or less than the transfer length, the device resistance is now dominated by the contact resistance. The contribution of the c-PCM resistance and the resistive liner resistance to the total resistance are small. As the contact length is further reduced the device resistance will be roughly proportional to $1/L_C$, or the device conductance will be proportional to $L_C$.

The applied electric current typically does not flow through the amorphous-phase portions 102 and 202 because the PCM bar that is in the amorphous-phase is a poor conductor of electricity. However, when the contact length is made so short that the resistance contribution from the contact reaches the resistance of the a-PCM, the above assumption is no longer valid.

Figure 3:
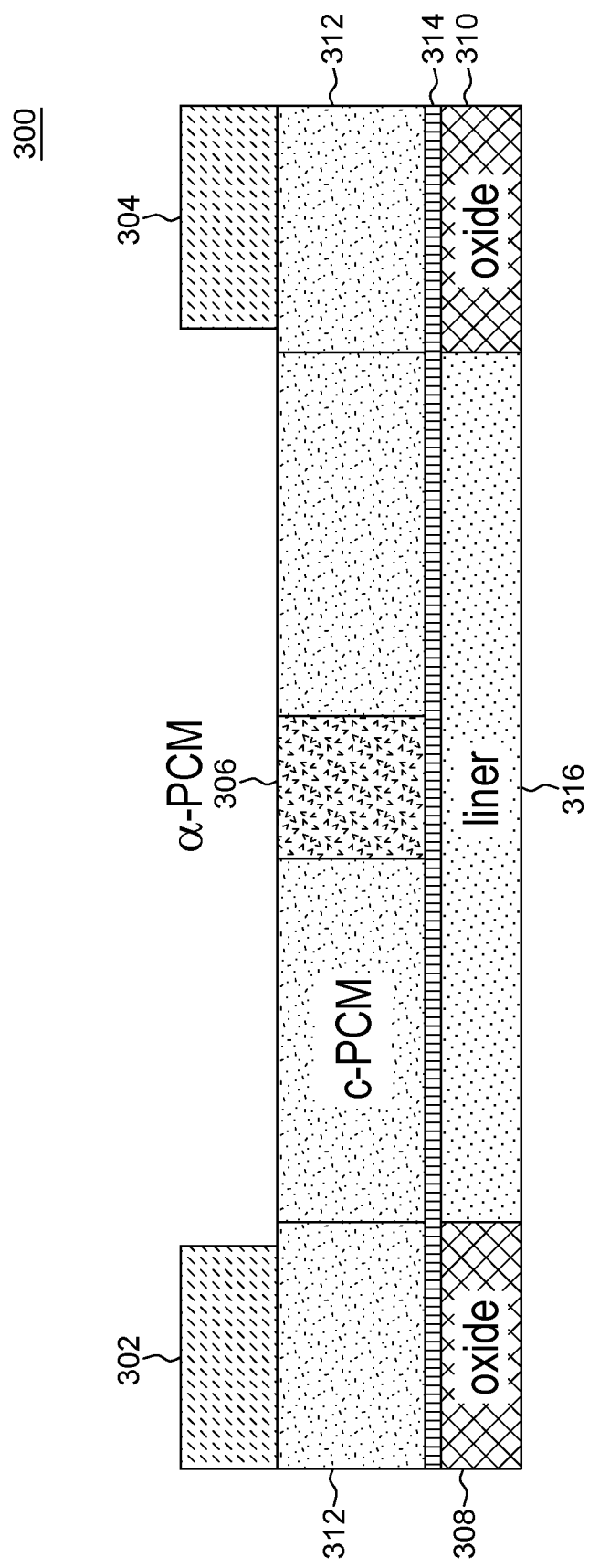
FIG. 3 is a block diagram view of a cross-section of a first embodiment of a structure according to the present invention.

Diagram 300 of FIG. 3 is a cross section view of the bridge PCM device following a "weak RESET" which forms an amorphous PCM region 308 at the narrow portion of the PCM bar. A top view of the same device is shown in Diagram 500. Diagram 300 includes the following components: ohmic contact 302, ohmic contact 304, amorphous-PCM portion 306, oxide layer 308, oxide layer 310, crystalline-PCM portion 312, engineered tuning interface 314, and resistive liner 316. As described above in connection with FIG. 1, the contact length between crystalline-phase portion 312 and resistive liner 316 is about one transfer length. In some embodiments of the present invention, the material that is selected for engineering tuning interface 314 will determine the contact resistance ($\rho_C$). The determination of the contact resistance will ultimately determine the transfer length (as described above in connection with formula F1). Therefore, the overall resistance of the PCM bar can be adjusted, or tuned, by changing the material of engineered tuning interface 314. The total device resistance in this the case of a weak RESET is approximately the c-PCM portion(s) resistance plus the liner resistance under the a-PCM.

Figure 4:
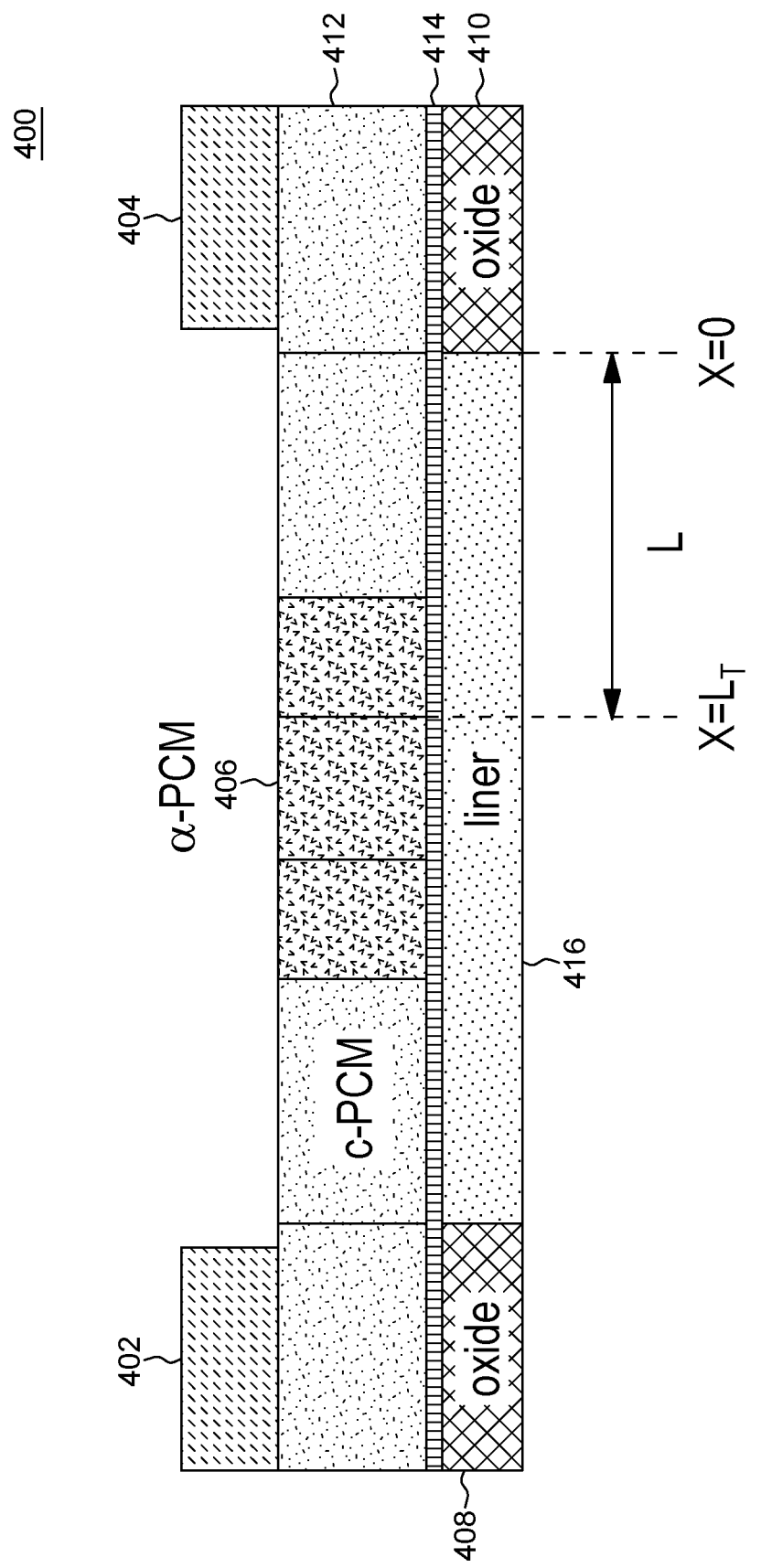
FIG. 4 is a block diagram view of a cross-section of a second embodiment of a structure according to the present invention.

Diagram 400 of FIG. 4 is a cross section view of the bridge PCM device following a "strong RESET" which forms an amorphous PCM region 406 at the narrow portion of the PCM bar and further extends into the wider portion of the PCM bar. A top view of the same device is shown in Diagram 600. Diagram 400 includes the following components: ohmic contact 402, ohmic contact 404, amorphous-PCM portion 406, oxide layer 408, oxide layer 410, crystalline-PCM portion 412, engineered tuning interface 414, and resistive liner 416. The total device resistance in this the case of a strong RESET is dominated by the contact resistance. The total resistance is approximately equal to $\rho_C/(W*L_C)$ plus the c-PCM portion(s) resistance, and the liner resistance under the a-PCM. W is the width of the contact and $L_C$ is the length of the contact.

We distinguish between programing operation and read operation. In a programing operation the amplitude of the RESET pulse that is applied to the device terminals 402 and 404 is large and will change the phase of the PCM. The RESET pulse is intended to melt-quench the PCM so the solidified material is left in the amorphous phase. The size of the amorphous PCM 406 in the case of a RESET operation, is proportional to the electric pulses amplitude that is applied to the PCM bar. Another programing operation is SET, which leads to a of decrease the amorphous region size or even have it fully crystalize. The SET pulse is usually smaller in amplitude than RESET and in most cases the pulse has a longer trailing edge. Using RESET and SET operations one can tune the device resistance to a desired value. When a read operation is performed a small amplitude pulse is used such that the size of the amorphous PCM region is not changed.

It is important to note that during a read operation the conduction of a steady electric current (or electric pulses) that is applied to the device primarily flows through c-PCM portion 412 to resistive liner 416. No substantial current passes through the amorphous region 406. This has the effect of reducing the resistance drift since the majority of the resistance drift occurs in the amorphous phase of PCM.

Figure 5:
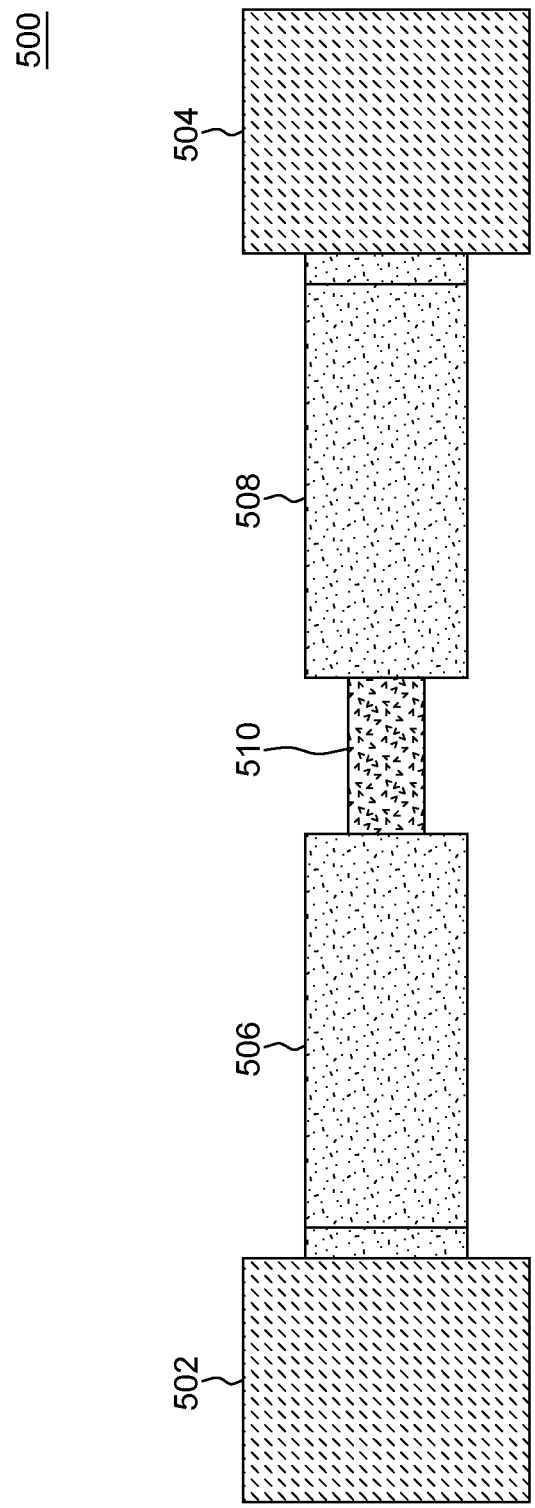
FIG. 5 is a block diagram of a top view of a first embodiment of a structure according to the present invention.

Diagram 500 of FIG. 5 is a top view of the bridge PCM material during a "weak RESET" operation. Diagram 500 includes the following components: ohmic contact 502, ohmic contact 504, first crystalline-phase portion 506, second crystalline-phase portion 508, and amorphous-phase portion 510. In some embodiments of the present invention, portions 506 and 508 can be thought of as being the same portion.

Figure 6:
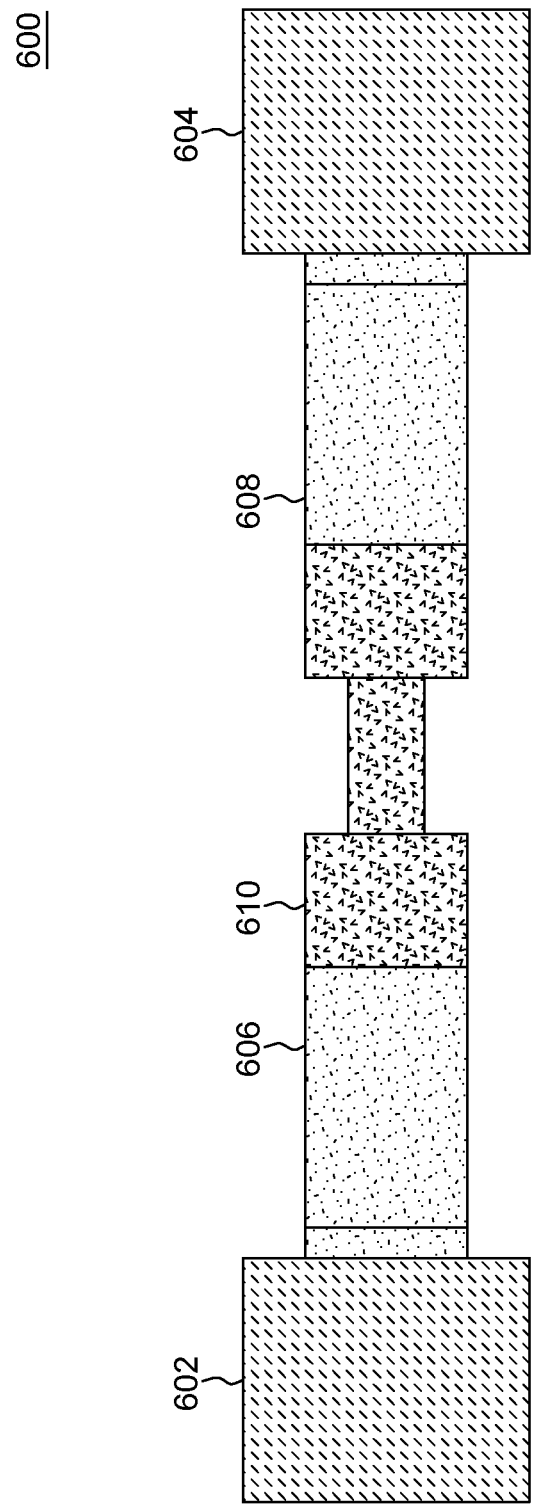
FIG. 6 is a block diagram of a top view of a second embodiment of a structure according to the present invention.

Diagram 600 of FIG. 6 is a top view of the bridge PCM material during a "strong RESET" operation. Diagram 600 includes the following components: ohmic contact 602, ohmic contact 604, first crystalline-phase portion 606, second crystalline-phase portion 608 and amorphous-phase portion 610. In some embodiments of the present invention, portions 606 and 608 can be thought of as being the same portion.

In some embodiments of the present invention, the PCM bar is encapsulated (not shown in the Figures). In some cases, the PCM bar is encapsulated in Silicon Nitride ($Si_3N_4$), $HFO_2$, and many other materials.

Figure 7:
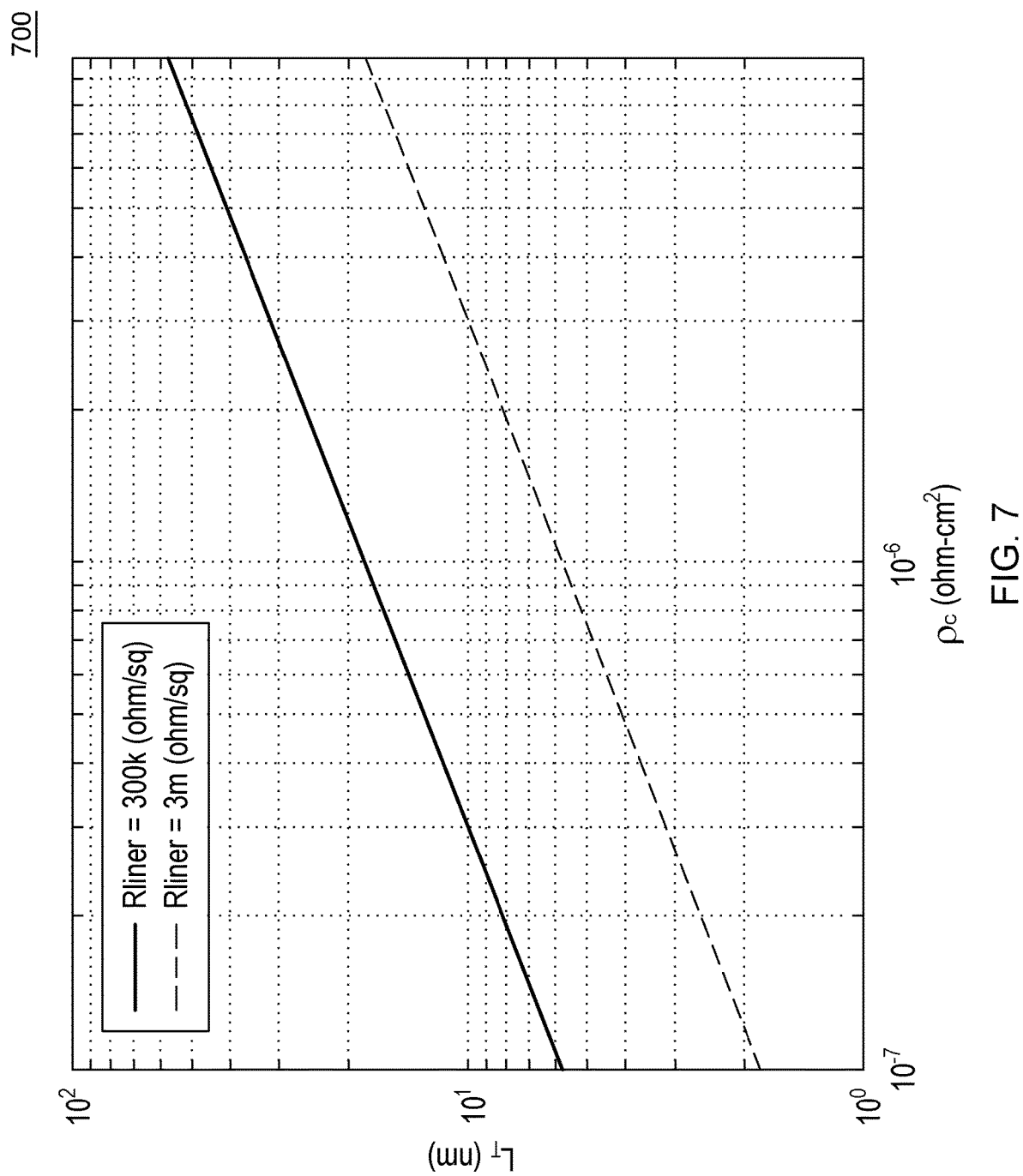
FIG. 7 is a graph view showing information that is helpful in understanding embodiments of the present invention.

Graph 700 of FIG. 7 is a graph that illustrates the relationship between the contact resistance ($\rho_C$) (discussed above in connection with Formula F1), the transfer length ($L_T$), and the resistance of the resistive liner ($R_{LINER}$).

Graph 700 shows that the selection of a $R_{LINER}$ with a lower resistance value yields a higher transfer length (or multiple transfer lengths).

Some embodiments of the present invention recognize that the choice of an engineered interface layer material (such as engineered tuning interface 414) is ultimately determinative in the strength and polarity of the interface dipole. Some embodiments additionally recognize the following: (i) the strength and polarity of the interface dipole can be controlled by geometric mean electronegativity; (ii) higher geometric mean electronegativity oxides create higher barrier heights between PCM and liner material; (iii) for higher $\rho_C$, high geometric mean electronegativity dielectric materials should be selected (such as $TiO_2$, $Al_2O_3$, $SiO_2$); and (iv) for lower $\rho_C$, low geometric mean electronegativity dielectric materials should be selected (such as group 2A and group 3B oxides).

The following chart (Table 1) is provided as an exemplary reference for selecting the engineered interface layer materials. Additionally, the Geometric mean electronegativity values are calculated using the Sanderson Criterion. The geometric mean electronegativity values are calculated by using the following formula: $(A_x B_y)^{1/x+y}$.

TABLE 1

| Choice of Engineered Interface Layer | | | |
|---|---|---|---|
| Element | Pauling Electronegativity | Dielectric Cap $A_X B_Y$ | Geometric Mean Electronegativity |
| Ba | 0.89 | BaO | 1.75 |
| La | 1.1 | LaN | 1.83 |
| Mg | 1.31 | MgO | 2.12 |
| Sr | 0.95 | $La_2O_3$ | 2.18 |
| Hf | 1.3 | $SrTiO_3$ | 2.26 |
| Al | 1.61 | $HfO_2$ | 2.49 |
| Ti | 1.54 | $Al_2O_3$ | 2.54 |
| Si | 1.9 | AlON | 2.56 |
| O | 3.44 | $TiO_2$ | 2.63 |
| N | 3.04 | $SiO_2$ | 2.82 |

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The following paragraphs set forth some definitions for certain words or terms for purposes of understanding and/or interpreting this document.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

Including/include/includes: unless otherwise explicitly noted, means "including but not necessarily limited to."

Receive/provide/send/input/output/report: unless otherwise explicitly specified, these words should not be taken to imply: (i) any particular degree of directness with respect to the relationship between their objects and subjects; and/or (ii) absence of intermediate components, actions and/or things interposed between their objects and subjects.

Comprise/comprises/comprising: As used in the specification (specifically outside of the claims section), this term is intended to be perfectly synonymous with the term "include" and its various conjugated forms (as defined herein in this specification). The term "comprise" (and its various conjugated forms) as used in the claims is to be interpreted in a manner that is consistent with patent claim interpretation.

Without substantial human intervention: a process that occurs automatically (often by operation of machine logic, such as software) with little or no human input; some examples that involve "no substantial human intervention" include: (i) computer is performing complex processing and a human switches the computer to an alternative power supply due to an outage of grid power so that processing continues uninterrupted; (ii) computer is about to perform resource intensive processing, and human confirms that the resource-intensive processing should indeed be undertaken (in this case, the process of confirmation, considered in isolation, is with substantial human intervention, but the resource intensive processing does not include any substantial human intervention, notwithstanding the simple yes-no style confirmation required to be made by a human); and (iii) using machine logic, a computer has made a weighty decision (for example, a decision to ground all airplanes in anticipation of bad weather), but, before implementing the weighty decision the computer must obtain simple yes-no style confirmation from a human source.

Automatically: without any human intervention.

What is claimed is:

1. A neuromorphic device comprising:
a phase change material (PCM) bar, with the phase change material bar being structured and configured to have at least two portions, a first narrow portion and a second narrow portion, that are joined by the first narrow portion, and with the first narrow portion being located at the center of the phase change material bar and the second narrow portion being located at the end of the PCM bar, wherein the PCM bar is encapsulated and wherein the PCM bar includes at least a first crystalline-phase portion and at least a first amorphous-phase portion;
a resistive liner located adjacent the phase change material bar, with the resistive liner being a conduit for conducting at least a portion of a first electric current, wherein the resistive liner includes an insulator region located at each end of the resistive liner and wherein the insulator region limits the resistive liner span on each side to one transfer length and wherein the one transfer length is measured from the second narrow portion end of the PCM bar to the start of the insulation region and wherein resistance of the resistive liner is equal to resistance of the first crystalline-phase portion of the PCM bar but lower than the first amorphous-phase portion of the PCM bar;
an interfacial layer located between the resistive liner and the phase change material bar, with the interfacial layer having a tunable contact resistance, based on composition and thickness of the interfacial layer; and
a set of ohmic contact portions, with at least one ohmic contact of the set of ohmic contact portions being located at each end of the phase change material bar.

2. The neuromorphic device of claim 1 wherein the contact length is measured from the end of an amorphous-phase portion of the phase change material bar to a first end of the insulator region.

3. The neuromorphic device of claim 1 wherein at least the first crystalline-phase portion is located at a first portion of the phase change material bar.

4. The neuromorphic device of claim 1 wherein the amorphous-phase portion is initially formed at the first narrow portion of the phase change material bar.

5. The neuromorphic device of claim 1 wherein the contact length is adjusted by modulating the amorphous-phase portion of the phase change material bar.

6. The neuromorphic device of claim 1 wherein resistance of the neuromorphic device is based on a first contact length between the first crystalline-phase portion of the phase change material bar and the resistive liner.

7. The neuromorphic device of claim 1 wherein resistance drift is reduced based on conducting the first electric current from the crystalline-phase portion of the phase change material bar through the resistive liner during a read operation.

8. The neuromorphic device of claim 6 wherein the resistance of the neuromorphic device is increased by decreasing the first contact length.

9. The neuromorphic device of claim 6 wherein the resistance of the neuromorphic device is decreased by increasing the first contact length.

10. The neuromorphic device of claim 1 wherein the resistance of the first amorphous-phase portion of the phase change material bar allows a maximum of one percent (1%) of the first electric current to flow through the first amorphous-phase portion.

11. The neuromorphic device of claim 1 wherein the electronic conductance between the set of the ohmic contacts is proportional to a length of contact between the crystalline-phase portion and the resistive liner when the length of contact is less than the length of one transfer length.

12. The neuromorphic device of claim 1, wherein the phase change material bar is comprised of at least one of $Ge_2Sb_2Te_5$, $Sb_2Te_3$, and GeTe.

13. The neuromorphic device of claim 1, wherein the resistive liner is comprised of at least one of TaN, amorphous carbon, TiN.

14. The neuromorphic device of claim 1, wherein the interfacial layer is comprised of at least one of $Si_3N_4$, $HfO_2$, $Al_2O_3$, $SiO_2$, $TiO_2$ and TaNO.

* * * * *